United States Patent [19]

Lemelson

[11] Patent Number: 4,960,643
[45] Date of Patent: Oct. 2, 1990

[54] COMPOSITE SYNTHETIC MATERIALS

[76] Inventor: Jerome H. Lemelson, 48 Parkside Dr., Princeton, N.J. 08540

[21] Appl. No.: 32,352

[22] Filed: Mar. 31, 1987

[51] Int. Cl.$^5$ .................. B32B 9/04; B32B 15/04; F16C 13/02; C10M 103/00

[52] U.S. Cl. ........................ 428/408; 428/336; 428/361; 428/368; 428/375; 428/403; 428/688; 428/700; 428/902; 252/29; 384/907.1

[58] Field of Search ............. 428/336, 361, 368, 375, 428/403, 408, 688, 700, 902; 384/907.1; 252/29.13, 12.4, 12; 423/446

[56] References Cited

U.S. PATENT DOCUMENTS

| | | | |
|---|---|---|---|
| 4,005,163 | 1/1977 | Bokros | 252/12 X |
| 4,214,037 | 7/1980 | Galasso et al. | 428/902 X |
| 4,554,208 | 11/1985 | Mactver et al. | 428/408 X |
| 4,663,183 | 5/1987 | Ovshinsky et al. | 427/39 |

FOREIGN PATENT DOCUMENTS

| | | | |
|---|---|---|---|
| 2926080 | 1/1981 | Fed. Rep. of Germany | 252/29 |
| 195094 | 10/1985 | Japan | 423/446 |

*Primary Examiner*—Merrell C. Cashion, Jr.
*Assistant Examiner*—Susan S. Ducker
*Attorney, Agent, or Firm*—Neil F. Markva

[57] ABSTRACT

Composite materials are in the form of particles, such as bits and short filaments, and combinations of such particles with matrix materials forming high strength, wear and corrosion resistant materials and may be shaped to define cutting tools, dies, mold components, electrodes, bearing components, finishing tools and the like. Structures include substrates and synthetic diamond particles encapsulated therein or bonded thereto have superior grinding, cutting and finishing characteristics. Particles are in the form of microbits, spheroids, single crystals, short narrow filaments and metal whiskers coated with synthetic diamond formed with a core of graphite, metal, metal compounds, metal alloys, ceramic, cermet, glass and composites thereof. Filaments and bits are coated with a lubricating film of wear resistant metal. Methods for producing such composite synthetic materials include the chemical vapor-deposition of carbon atoms from hydrocarbon gas molecules in a high intensity radiation field such as a microwave energy field.

22 Claims, 1 Drawing Sheet

COMPOSITE SYNTHETIC MATERIALS

FIELD OF THE INVENTION

This invention relates to new and improved structures in synthetic materials, preferably in the form of particles including bits and filaments which are formed of a plurality of materials including a hard core material and a synthetic diamond material coating such core. The field of the invention also includes articles made from such particles and, in certain embodiments, additional amounts of synthetic diamond material deposited thereon or throughout the composite structure. The invention also resides in improved articles and particles formed of a plurality of elements which are interfacially welded or bonded with synthetic diamond or diamond-like material.

BACKGROUND OF THE INVENTION

The prior art consists of particle structures formed of metal or metal alloys, which particles are used in making articles of manufacture by sintering and fusing surface portions of such particles together. It is also known to make bits or particles of synthetic diamond material formed at very high pressures and temperatures. U.S. Pat. No. 4,434,188 discloses a chemical vapor deposition process employing microwave energy passed through a hydrocarbon gas to pyrolize the hydrocarbon by thermal energy and produce free carbon which is deposited as a coating of synthetic diamond. U.S. Pat. No. 4,504,519 discloses a hybrid process employing a radio frequency-generated plasma and a pair of spaced apart electrodes to decompose an alkane to form an amorphous carbonaceous diamond-like film. U.S. Pat. No. 4,490,229 discloses the deposition of a carbon film on a surface by exposure to an argon ion beam containing a hydrocarbon.

SUMMARY OF THE INVENTION

This invention relates to improvements in the structures of composite materials which are particularly subject to wear and loading requiring wear resistance and high strength, wherein such structures are made, in part, of carbon which has been converted to hard diamond-like material and are in one or more forms including short filaments, particles and chips thereof. In one form of the invention, such particles or filaments are randomly disposed as a layer against the surface of a substrate and are held thereagainst by similar hard diamond-like material, high strength carbon, metal, plastic resin, ceramic or a combination of such materials. In a particular form, the structures are formed of high strength carbon and diamond filaments and a matrix bonding same together.

Accordingly it is a primary object of this invention to provide new and improved structures in composite materials having high strength.

Another object is to provide an improved structure in a composite material having a surface stratum of high strength and high wear resistant characteristics.

Another object is to provide improved composite materials which are formed in part of synthetically produced diamond-like materials.

Another object is to provide an improved hard surface material made of short filaments of diamond-like material and a binder.

Another object is to provide an improved hard surface material made of carbon in two or more forms, one of which is a high strength graphite and another being a diamond-like formation of carbon.

Another object is to provide an improved high strength composite material formed of a number of forms of carbon including graphite and synthetic diamond or diamond-like material.

Another object is to provide an improved composite material formed of graphite, diamond or diamond-like material and a matrix.

Another object is to provide high strength composite materials which are coated with carbon in the form of a diamond-like material.

Another object is to provide a coating or outer layer for an article of manufacture formed of a synthetic diamond or diamond-like material.

Another object is to provide coatings or outer layers for articles of manufacture which are made of particles of synthetic diamond or particles coated with such synthetic diamond.

Another object is to provide high strength particles made entirely of synthetic diamond.

Another object is to provide improved composite particles and filaments containing a layer or surface stratum of synthetic diamond which is coated with a protective lubricating film or outer layer, such as chromium-plated or vapor-deposited thereon.

Another object is to provide improved composite articles of manufacture, such as cutting and forming tools, electrodes and the like subject to wear and erosion, having an outer layer formed of synthetic diamond and a film coating same to reduce wear and attrition.

Another object is to provide improvements in the internal structure of matter effected by synthetic diamond laced throughout the crystallite structure thereof.

Another objected is to provide improvements in the structure of matter having synthetic diamond material provided at the crystallite interfacial structure thereof for enhancing the strength thereof.

Another object is to provide an improved particle of matter formed entirely of carbon with the outer layer thereof defining a synthetic diamond structure.

Another object is to provide improvements in weldings between plural metal members or portions of the same member, by providing synthetic diamond material at the weld interface.

Another object is to provide improvements in metal or ceramic materials having porous structures, the walls of the interstices of which are coated with high strength material such as synthetic diamond.

Another object is to provide improved structures in fine diameter tubing useful in the construction of filters and the like.

Another object is to provide improved filter structures made at least, in part, of synthetic diamond.

Another object is to provide improved methods for producing articles of manufacture made, in part, of synthetic diamond.

Another object is to provide a method for producing particles of synthetic diamond or diamond-like material.

With the above and such other objects in view as may hereinafter more fully appear, the invention consists of the novel material constructions and compositions as well as methods for making same, as will be more fully described and illustrated in the accompanying drawings, but it is to be understood that variations, changes and modifications may be resorted to which fall within the scop of the invention as claimed.

DETAILED DESCRIPTION OF THE INVENTION

Figure 1:
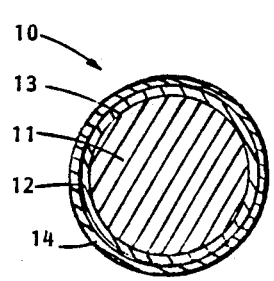
FIG. 1 is a cross-sectional view of a composite synthetically produced particle in the form of a spheroid or cylindrical element formed at least, in part, of synthetic diamond.

FIG. 1 shows a first composite material element 10 which may vary in size from a small particle several thousandths of an inch or less in diameter to a fraction of an inch or greater and which has high strength and resistance to wear. The element 10 is generally spherical and has a solid core 11 of high strength material coated with one or more layers 12 and 14 of wear resistant material or materials.

In a preferred form core 11 is formed of high strength graphite carbon or metal. A coating 12 is contiguously desposed core 11 and is formed of very high strength carbon, such as synthetic diamond or a diamond-like form of carbon. Coating 12 is deposited as atoms of carbon derived from molecules of a carbon-containing gas, such as methane. The carbon atoms are stripped from the gas when radiant energy, such as microwave energy, is passed through such gas while core 11 is suspended or falling through such gas by means described hereafter. 10 A layer or coating 14 is added to the structure of element 10 and may be formed of one or more elements, alloys or compounds depending on its intended function. If element 10 is a ball employed in a ball bearing, layer 14 may comprise chromium which is plated, vapor-deposited or otherwise deposited on outer surface 13 of core 11, and serves to lubricate and protect outer surface 13 from scratching and wear. The coating or layer 12 of synthetic diamond may vary from several thousandths of an inch or less in thickness, or greater, depending on the required physical characteristics of element 10. Layer or coating 13 may vary from substantially less than a thousandth of an inch to several thousandths of an inch thick or more, again depending upon the intended use and application of element 10.

If element 10 is to be used as a ball or cylindrical roller in a ball or roller bearing, core 11 may be formed of a suitable high strength metal, metal alloy or ceramic material and the interface which is located between the outer surface 13 of the core and the inner surface of the synthetic diamond coating 12, may comprise a molecular bond. Such metals as high strength steel, chromium, titanium, zirconium, tungsten, vanadium and the like and alloys thereof, may comprise core 11. High strength carbides, nitrides, silicides, oxides, borides and the like of such metals may be used in core 11. In a particular form of the invention, core 11 may comprise a hard material such as cubic boron nitride or other high strength compound formed as a single crystal thereof or hard ceramic material.

Figure 2:
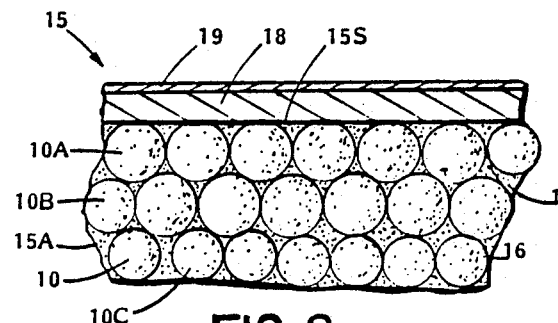
FIG. 2 is a fragmentary sectional view of a composite article or material formed of a plurality of elements of the type shown in FIG. 1 and other materials forming a high strength structure.

Coating 13 may also serve to bond elements or particles 10 together when compressed and heated to form high strength articles and materials of a multitude of such particles, such as illustrated in FIG. 2. Materials comprising coating 13 may include metals, such as chromium, vanadium, aluminum, zirconium or other metals or metal alloys which will melt and fuse under heat and pressure applied in compacting and sintering a multitude of such particles, such as in a die or between rollers. Under suitable pressure and temperature conditions, the synthetic diamond surface coatings 12 of compacted particles 10 may be caused to weld or fuse together, with or without the formation of the core portion and coatings to form high strength porous or nonporous structures, which have interfacial boundaries or internal cell surfaces formed of diamond or diamond-like forms of carbon, which greatly enhance the strength of the composite structures.

In FIG. 2, a composite structure 15 is formed of a multitude of particles 10A, 10B, 10C, etc. of the same size or of different sizes as shown, which are surface bonded to each other forming a cellular or porous structure. The interstices 16 between particles 10, 10A, 10B and 10C may be void of matter or filled with a high strength material 17 flowed therein in a molten or liquid state or mixed with the elements 10 as fine particles which are smaller than elements 10. Such material 17 may be formed of metal powder which melts under the compacting pressure and temperature and fuses to a solid intersticial mass between elements 10. If structure 15 is formed porous, it may define a very high strength filter which is wear resistant.

In a modified form of the invention illustrated in FIG. 2, metal or diamond particles 10 may be compacted and sintered with a resin or other material which is burned away with heat leaving a porous, sintered structure. Such structure may be subject to a carbon-containing gas, such as methane, and H2 passed through the cells or pores thereof while microwave energy is directed through the structure to heat same and to cause carbon atoms of the gas molecules to be stripped therefrom and deposited on the surfaces of the internal cells or interstices thereof until the desired amount of diamond-like carbon has so deposited to form a composite cellular structure of high strength which may be used per se or filled with metal, ceramic, glass or plastic filler materials flowed into the cells thereof. In another form, such synthetic diamond containing porous structure may be partially or completely compressed between rollers or dies to form solid material of high strength containing synthetic diamond as part of its internal structure.

Composite structure 15 is shown having a first coating 18 on a surface 15S thereof and a second coating 19 on the surface coating 18. Coating 18 may comprise a hard diamond-like form of carbon deposited as described from carbon atoms stripped from methane gas molecules or the like with microwave energy, preferably in the presence of molecules of hydrogen to provide a reaction in which such carbon atoms are separated from the gas molecules and are deposited thereafter on the surface or surfaces against which the microwave energy is directed.

Coating 19 may comprise a thin layer of chromium which serves as a lubricant or wear resistant outer layer for the synthetic diamond layer 18. Such coating 19 may be employed per se to serve as a lubricant, wear and temperature resistant layer or may be coated, impregnated or implanted with a further protective material such as metal, ceramic or plastic material. One or more of such latter materials may also be coated or implanted on the outer surface 15S of the particle or filament containing substrate portion 15A of the composite structure 15 to strengthen and protect same during use.

Composite structure 15 may be formed by casting and/or compressing the particles or filaments 10 thereof per se or in mixture with the matrix or bonding material between dies, with or without the application of heat thereto to effect sintering or bonding of the particles together. The particles or filaments 10 may also be controllably mixed with a molten metal matrix and may be sufficiently fine in powdered form to provide reinforcing means at the grain or crystalline boundaries of the internal structure formed of such metal. Accordingly, such particles or filaments 10 may be in the order of microns in diameter for grain boundary applications or may be larger in diameter for applications where they form the major portion of the composite structure.

Figure 3:
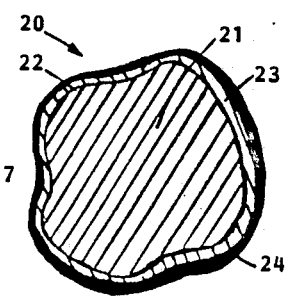
FIG. 3 is a cross-sectional view of a high strength element or particle having an irregular shape and utilizable as either a reinforcement for composite materials and/or as an abrasive bit or cutting tool.

FIG. 3 shows a modified form of particle or filament 20 having a core portion 21 of irregular shape with an outer surface 22 having a coating or layer 23 formed thereon and bonded thereto. As in the embodiment of FIG. 1, core 21 may be made of high strength metal, metal composite or alloy, ceramic cermet, metal compound, graphite or synthetic diamond as described. Core 21 may also comprise a single crystal or whisker or metal or other high strength material. coated or deposited on the outer surface of coating 23 is second coating 24, preferably in the form of a protective lubricating or corrosion resistant film as described. Particle 20 may vary from 0.0001" or less in diameter to several thousandths of an inch or more in diameter, depending on its intended use or application.

Figure 4:
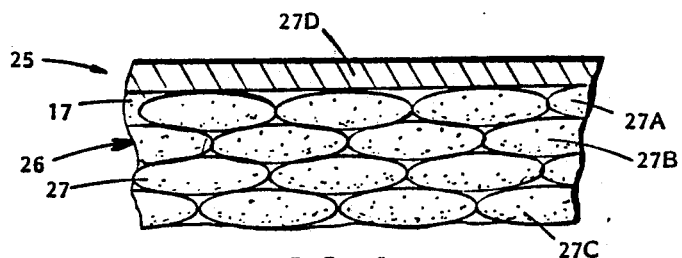
FIG. 4 is a fragmentary sectional view of another composite article having reinforcing elements of flatter cross-section than those of FIG. 2.

FIG. 4 shows a portion of a composite structure 25 including a layer or substrate 26 formed of a multitude of particles or filaments 27, 27A, 27B and 27C of elliptical cross-section and are closely compacted together. Fine voids between 27, 27A, etc. may remain after compaction, be filled with binder or matrix material 17 as described or may be completely eliminated upon the application of suitable force to the particles between dies or rollers. While the individual particles or filaments 27, 27A, etc. may be made of synthetic diamond or coated therewith as described, the outer surface of substrate 26 is shown with a coating 27D of synthetic diamond, the outer surface of coating 27D may also be coated with a protective film or lubricant as in the composite structure of FIG. 2.

While the particles or filaments 27, 27A, etc. forming the layer or substrate 26 of FIG. 4 are shown as substantially uniform in shape and distribution, they may also comprise a mixture of filaments and particles of similar or different shapes and may include particles of the types shown in FIGS. 1 and 3, mixed together or forming different layers of the substrate. Such substrate or layer 26 may also form part of a layer bonded to and covering a rigid article or substrate such as a tool base, ball, roller or slide bearing or other device subject to high force and attition during use.

Figure 5:
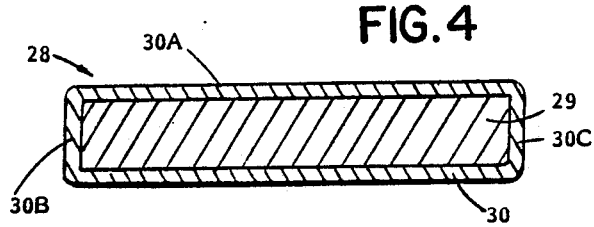
FIG. 5 is a sectional view of a short filament for use in producing reinforced structures and surface coatings or a cylindrical roll for use in a bearing.

In FIG. 5, the elongated element 28 of FIG. 5 comprises a short high strength cylindrically shaped or otherwise shaped composite filament including an elongated core portion 29 of high strength metal, ceramic, glass or graphite. A coating 30 completely surrounds core portion 29 and is formed of synthetic diamond or diamond-like material deposited on the entire outer surface of portion 29. The diamond coating includes cylindrical portion 30A of the diamond coating and end portions 30B and 30C.

Figure 6:
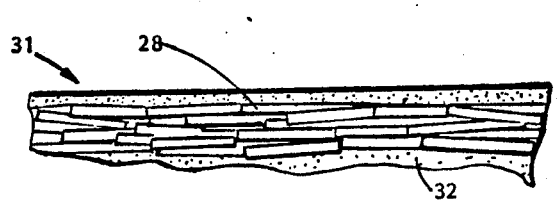
FIG. 6 is a fragmentary sectional view of another composite material or article having a layer of reinforcing filaments at or near the surface thereof.

In FIG. 6, a multitude of the composite filaments 28 of FIG. 5, are shown closely spaced or overlaying each other to form a composite material 31 containing a matrix material 32 filling the voids between adjacent filaments 28 and bonding same together to form a high strength article or substrate. The filaments or fibers 28 are either formed as shown in FIG. 5, or are made of synthetic diamond per se or are composite, short filamental structures cut from a longer length of such synthetic diamond filaments.

The matrix material 32 may comprise a high strength synthetic resin, resins or resin alloys, metal, metals or metal alloys or high strength ceramic material provided originally in powdered or liquid form and set, solidified or sintered to shape after the filaments are mixed or impregnated therewith. The matrix material 32 may also be formed of a mixture of finely divided synthetic diamond particles and a metal such as aluminum or other metal or metal alloy. Such particles are homogeneously distributed throughout the matrix and serve to substantially enhance the strength of composite material 31 which may be fabricated with or without filaments 28 by casting, injection molding, spinning or extruding the molten metal and particle mixture or by heating and compacting a homogeneous mixture of powdered metal and synthetic diamond particles of the type illustrated in FIGS. 1, 3 and/or 5.

Figure 7:
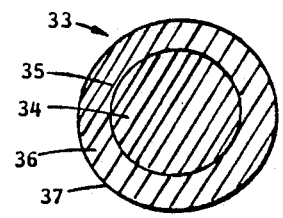
FIG. 7 is a cross-sectional view of a filament, ball or spherical particle made entirely of diamond including a diamond core and a coating of synthetic diamond deposited as a layer on the entire outer surface of the core.

FIG. 7 shows a composite particle or filament 33 of spherical or cylindrical shape, although it may be irregular in shape. Filament 33 may be employed with a multitude of similar particles or filaments as a reinforcement for material or as an abrasive bit, tool or tool component, ball or roller for a ball or roller bearing, etc. Filament 33 includes a core portion 34 made of synthetic diamond and having an outer layer 36 formed in situ against the outer surface 35 which is also formed of synthetic diamond. By depositing or growing the outer layer 36 of synthetic diamond on a core made of synthetic diamond, substantially larger particles, balls or filaments may be made of synthetic diamond material than is producible by the means used for forming core 34.

Such outer layer 36 may be deposited on outer surface 35 of core 34 while core 34 is suspended in a fluidized stream or streams or is otherwise levitated and/or while it is falling freely through space or caused to roll at constant rate across a surface in an atmosphere of a gas comprising molecules of a carbon atom-containing compound, such as methane, in the presence of adiant energy such as microwave energy, as disclosed in my copending patent application serial number.

Figure 8:
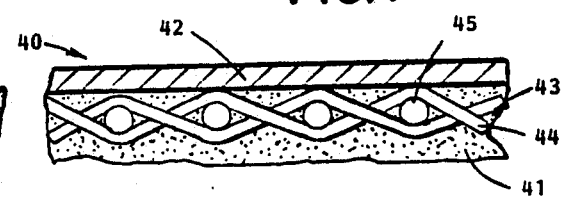
FIG. 8 is a fragmentary sectional view of a composite structure made of a hard substrate material and a layer containing a high strength woven graphite material encapsulated therein.

FIG. 8 shows another composite structure 40 employing a plurality of materials of the types described above. The composite 40 may form part of a substrate or a layer portion of a substrate or article, and contains a matrix portion 41 made of one of the materials described above. Matrix portion 41 encapsulates one or more layers or cloths of woven filaments 43, 44, 45, one of which layers is shown in the drawing. The filaments 43, 44 and 45 may be woven of carbon or high strength graphite or pyrolized from a suitable resin to form such carbon, and may be coated, as described, with synthetic diamond material formed thereon or used per se. The outer layer 42 or composite 40 is formed of one or more of the material described above, such as synthetic diamond and one or more protective outer coatings. Woven filaments 43, 44 and 45 may also be made of high strength metal wire such as stainless steel or the like.

In the composite 40 of FIG. 8, matrix material 41 may be formed of molten metal per se or homogeneously mixed with synthetic diamond and/or particles of other high strength material which add substantially to the strength of the matrix. Such matrix may also be made of a high temperature resistant ceramic or cermet material employed per se or homogeneously mixed with particles of synthetic diamond employed per se or in combination with one of the metals or metal compounds described herein.

If the layer or woven high temperature material 43, 44 and 45 is disposed immediately below the hard surface coating layer 42, it may be employed to support and strengthen the outer layer or layers of high strength wear-resistant material and absorb a substantial portion of the shock forces applied thereto during use. Composite material 40 may be employed to fabricate cutting and forming tools, bearings and bearing components such as races, rollers and balls, and a variety of machine components subject to high impact, wear, heat corrosion, shock and vibration and the like during use.

The composite structures 15, 25, 31 and 40 may serve as cutting or forming tools and/or substrates therefor where the high strength of the composite serves to resist deformation while the synthetic diamond coating resists wear and abrasion, chemical and temperature corrosion. Accordingly, such substrates and synthetic diamond coatings may define one or more cutting edges and may serve such functions as lathe cutting tools or tool inserts, milling cutters, drills and like.

Particles or bits of the types shown in FIGS. 1, 3 and 7 may be retained against the outer surfaces or surface strata of the composites of FIGS. 2, 4, 5, 6 and 8 as well as those of FIGS. 9 to 12, described hereafter, to form abrasive cutting wheels, grinding and finishing wheels, burrs and the like. Such bits or particles are bonded against the substrate with synthetic diamond which is deposited as described on the substrate and over and around the bits to form high strength cutting and grinding tools, tool inserts and the like. Metal coatings, such as the described chromium coatings, which are vapor-deposited, electroplated or flame-sprayed, may be employed to bond such particles to the substrate surface.

Figure 9:
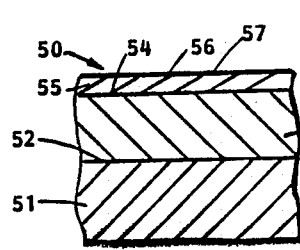
FIG. 9 is a fragmentary sectional view of a composite material having a high strength sheet-like or plate substrate and a layer of amorphous metal capped by a synthetic diamond material.

FIG. 9 shows a high strength composite structure 50 comprising a base or substrate 51, layer 53 and coating 55. Substrate 51 may be a sheet or plate or other shape molded, cast, extruded, machined or otherwise formed of a suitable metal, ceramic, graphite, plastic or composite material of defined shape having an outer surface 52. Layer 53 is welded or bonded thereto and formed of an amorphous or non-crystalline metal. A hard material coating 55 is disposed on outer surface 54 of layer 53 and is composed of a material such as synthetic diamond formed thereon by deposition of carbon atoms as described herein. Coating 55 protects the high strength amorphous metal from wear and corrosion and strengthens composite 50. The diamond coating or layer 55 may have its outer surface 56 coated with a further metal layer 57 such as chromium or other material for protecting or lubricating same. In a modified form, substrate 51 may be made entirely of non-crystalline metal or a composite of non-crystalline metal and reinforcing elements such as particles of synthetic diamond as described.

Figure 10:
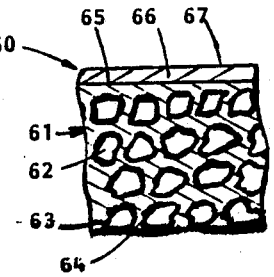
FIG. 10 is a fragmentary sectional view of a composite material having a high strength cellular substrate having cells coated with a synthetic diamond material.

FIG. 10 shows an improved high strength material structure 60 formed of a substrate 61 made of cellular or porous metal having open cells 62 defining voids in the material. Substrate 61 may comprise metal, ceramic, cermet or plastic formed cellular by any known method. The substrate 61 either has its cells 62 open or interconnected as shown in FIG. 10 or was in such condition as formed. With an open cell structure, substrate 61 is subject to a flow of molecules of a liquid or gas containing carbon atoms, such as a mixture of methane and hydrogen gas. When the radiant energy of microwave energy is directed through substrate 61 during such flow, it causes carbon atoms of such gas to deposit as a layer 64 on the inside walls 63 of such cells.

In one form, cells 62 remain open and interconnected with each other including a surface or surfaces of substrate 61 to permit a liquid or gas to be passed through the cellular structure and to be filtered of impurities, catalytically reacted on by the material of the substrate or otherwise affected thereby. In a second form, open cells 62 may be closed by material deposited therein, such as the synthetic diamond material 64 or a subsequently applied material to provide a lightweight high strength structure. In yet another form, cells 62 may be collapsed by passing substrate 61 between forming rolls to reduce its thickness with or without the application of heat thereto or by compressing same between reciprocating dies.

Layer 66 composed of synthetic diamond and/or other suitable protective or lubricating material may be coated as described on outer surface 65 of substrate 61. Outer surface 67 may be coated with a thin film of coating of a lubricating material, such as chromium.

Figure 11:
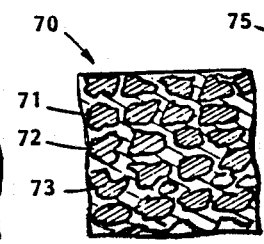
FIG. 11 is a fragmentary sectional view of a composite material having a high strength cellular substrate having cells thereof filled with high strength synthetic diamond.

FIG. 11 shows a composite 70 including substrate 71 formed of cellular metal, ceramic or plastic having cells 72 filled with a suitable high strength material 73 such as synthetic diamond for strengthening same and/or serving as abrasive particles permitting composite 70 to be used as a cutting or grinding tool.

Figure 12:
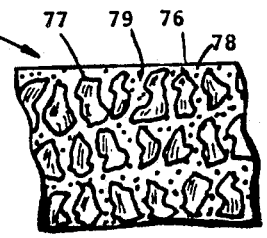
FIG. 12 is a fragmentary sectional view of a composite material having a high strength solid structure formed with crystallites and having interstices containing diamond particles.

FIG. 12 illustrates a portion of a high strength composite 75 including substrate 76 formed of material such as metal, ceramic or plastic and having a crystallite structure with crystals 77. Matrix 78 may be a non-crystalline metal or contain metal crystals 77 with a finely divided form of synthetic diamond particles 79 homogeneously dispersed throughout. Particles 79 serve to enhance the strength of the structure of composite 75.

Modified forms of the particles and structures shown in the drawings and described above are noted as follows:

1. The core element 11 of FIG. 1 may have a diameter in the range of about 0.050" to 1.0" or more with the coating or combined coatings thereon of synthetic diamond and outer metal film or layer in the range of 0.001" to about 0.010" or more to permit the composite ball or roller to be used with similar spheres or rollers in a ball or roller bearing. The core elements may comprise balls or cylinders for bearing components made of high strength steel or other metal having superior surface wear and crush resistance characteristics.

2. Core element 11 of FIG. 1 may also comprise a high strength metal filament or whisker, graphite or ceramic material varying from 0.0001" to 0.006" in diameter and 0.001" to about 0.250" long for use as high strength reinforcing filament elements in a binder or matrix surrounding a multitude of same.

3. Core element 21 of irregular particle 20 may be formed of a synthetic or natural diamond bit to be used as an abrasive bit or cutting tool varying from about 0.001" to 0.060" in diameter or greater. Core 21 may also be cubic boron nitride and may be used as a cutting tool or insert per se or held in a binder, such as an adhesive against a flexible sheet of plastic, paper, cloth or metal to be used as a file, sanding or grinding material. It may also be embedded in a coating or base material to form an abrading or cutting tool or file.

4. The core elements 11, 21, 27, 29, etc. may also comprise an irregular bit, spheroid, cylinder, strip or other shape made of a non-crystalline amorphous metal completely or partly coated with synthetic diamond with an overcoating as described.

5. The thickness of any of the coatings depends on the size of the article or particle to be coated, the function or intended use or uses thereof and the physical strength, wear resistance, corrosion resistance, or other physical characteristic intended to be imparted by the synthetic diamond coating. Thus, the thickness of such coating may vary from a thin film composed of a small number of layers of carbon atoms in thickness to films varying from a few millionths of an inch to several thousandths of an inch or more. For many particle applications involving the use of reinforcing bits or short filaments, such thin films may suffice for many applications. Larger abrasive bits or cutting tools, ball or roller elements for bearings and the like may require a coating of synthetic diamond varying in thickness from several thousandths of an inch to several hundred thousandths of an inch or more.

6. Alloys or mixtures of carbon in one or more forms of synthetic diamond; high strength metals or metal compounds as described and carbon such as synthetic diamond or the latter homogeneously mixed with other material, such as ceramic or nonmetal(s) may be formed in situ on a substrate of the types described here. Such substrates may be produced by the deposition thereof from molecules of a gas or vapor using microwave energy to effect such deposition to impart suitable improved physical characteristics to the coatings 12, 18, 23, 27D, 30, 36, etc. described above. Such materials may also be added to the synthetic diamond coatings by beam deposition or ion implantation techniques during or after the deposition of the carbon atoms comprising the synthetic diamond portion(s) of the coating.

7. Alternate layers of the same or different forms of carbon, such as synthetic diamond or diamond-like materials may be deposited, as described, by ion implantation, plasma arc, vapor deposition or other means per se or interposed between layers of other high strength material(s) of the types described above to from very high strength composites fromed of many of such layers of carbon, synthetic diamond-like forms of diamond, metals, alloys and compounds.

8. The cores of the structures of filaments made in accordance with the structures of FIGS. 1 and 7 may be made of tubular formations of the material(s) described with the ends thereof open to permit the passage of a fluid therethrough such as in filtration or otherwise processing same. A multitude of such short filaments may be held together parallel to each other in a sheet-like array or substrate to form a filter for gas or liquids. Such short composite filaments may also be coated on the interior with synthetic diamond by passing gas molecules containing carbon atoms therethrough and utilizing microwave energy to strip such atoms form their molecules and effect their uniform deposition on the inside surfaces of the filaments or tubes as described.

9. Conventional cutting tools, such as lathe cutting tools, milling cutters, boring cutters, drill bits, shear and knife blades, razor blades and the like may be formed of metal such as tool steel, stainless steel, ceramics and ceramic composites with cutting edge portions thereof defined by tapered surfaces which converge to an edge or near edge. Synthetic diamond coatings, as described, may be applied to the entire tool surfaces, a portion thereof which extends circumferentially around the tool or tool bit containing the cutting edge or edges or may extend just along the converging surfaces near the cutting edge portion or portions thereof by selectively depositing same through a mast. A chromium outer film may be used for lubrication.

10. Welds between two or more metal components may be protected against temperature and chemical corrosion, strengthened and prevented from developing stress cracks and the like by selectively depositing synthetic diamond material, as described, employing molecules of hydrocarbon gas and hydrogen through which microwave energy is either directed as a narrow beam against the weld area or through a mast having an opening or openings aligned with the weld or welds being so coated. Alternatively, an entire portion of the assembly containing the weld or welds or a plurality of such portions may be selectively coated with synthetic diamond as described. Fine bits of synthetic diamond may also be mixed with the weld rod and form part of the weld structure.

11. Welds between metal components, such as components made of steel, stainless steel, titanium, aluminum and other metals may be made employing welding rod made of a mixture of powders of one or more conventional weld metals, a suitable welding flux and particles of synthetic diamond produced as described or by other means. Due to their high temperature resistance, such synthetic diamond particles are not destroyed during welding and remain intact to be more or less evenly dispersed throughout the portion of the weld produced from the welding rod.

Such synthetic diamond may be 0.001" or less in diameter. Larger particles may also be employed as a mixture of different diameter particles. A weld made of such welding rod may also be capped with a thin layer or film of synthetic diamond formed from carbon atoms deposited from molecules of liquid or gas hydrocarbon material of one or more of the types described. Such deposition will take place during and/or after welding as a result of radiation generated by a microwave energy generator and/or a laser, molecular bean generator or electron gun which may form part of the welding apparatus. Such radiation generation means may be operated after welding while the welded assembly is in a reaction chamber containing suitable hydrocarbon fluid as an atmosphere and/or cause the radiation to be directed as a flow against the weld area or areas. Such hydrocarbon in liquid or solid form may also be a component of the welding rod, wire or powder caused to flow to the weld area during welding.

12. Synthetic diamond applied as a coating to an article or weld may also be operated on with an ion beam to implant same deep within the surface stratum of the article. One or more domains of a variety of elements and compounds may be implanted within the surface stratum of such synthetic diamond to enhance and tailor or change the physical and/or electric properties of the material receiving the implant or implants.

13. Compounds of synthetic diamond and other materials such as metals, metal alloys, plastic resins and various ceramic materials may be formed while the metal, ceramic or resin is in a liquid or molten condition. A hydrocarbon gas and/or vapor of one or more of the types described is provided above the liquid surface. Carbon atoms are separated or stripped from their molecules in the hydrocarbon with radiant energy such as microwave energy directed through the gas or vapor into the melt. As such carbon atoms deposit and form synthetic diamond, they may remain on the melt and/or be mixed with the metal or ceramic material to become laced throughout the resulting material when it solidifies into a select shape or shapes by known fabricating means.

13. Cutting and abrading tools, dies and the like may made of the composite structures illustrated in FIGS. 1-12. Tapered outer surface portions define cutting or abrading edges formed of a hard tapered base or substrate made of tool steel, cubic boron nitride, carbide, silicide or nitride of a metal, hard ceramic or high temperature resistant plastic resin coated with synthetic diamond along at least its tapered cutting edge. Such synthetic diamond may also be deposited as a film or a plurality of film layers to coat the entire portion of the tool containing the cutting edge or edges.

The entire diamond film coating may be plated or otherwise coated with a lubricating film or layer of chromium of other hard wear resistant lubricant. Such lubricant film serves to protect and prevent destruction of the synthetic diamond film due to attrition during cutting operations. Such chromium plate or film may extend to or near the cutting edge or edges of the tool from a location along or beyond the tapered portion of the edge. The chromium layer and/or the diamond film layer may contain fine particles of synthetic diamond or bits fabricated as in FIGS. 1, 3 and 7 disposed between such layers by the materials thereof or bonded to the outer surface of the tool substrate by the diamond film deposited thereon. In other words, such fine hard bits are disposed on the outer surface of the substrate or diamond film and the bonding film is deposited thereover and on the substrate to form the composite structure which may be used for cutting and/or abrading materials such as metals and other materials.

The composite structures illustrated in the drawings or modifications thereof may be used in the construction of microminiature electronic circuits, circuit elements and devices associated with the transmission and processing of electrical energy and signals as well as electro-optical devices and circuits. Such composites may form the circuit elements and/or substrates and protective coatings on such circuits and devices operable to provide temperature corrosion resistance and to add strength thereto. In such constructions, electrical insulation between conducting layers and/or semiconducting layers or components may be provided by either depositing insulating material or a metal film thereon and converting same to the nonconducting oxide of the metal formed in situ thereon.

The surface of a synthetic diamond substrate or coating as described may be rendered non-conducting or semiconducting by exposing same to one or more chemicals operable to form compounds of carbon thereon which have such insulating or semiconducting properties. Such chemical processing may take place in the presence of heat, such as heat generated in the surface by microwave energy or heat selectively applied to the surface stratum and/or chemical thereon by a laser beam or other form of radiation beam. Such beam is selectively directed against predetermined portions of the diamond coating or substrate surface to convert only such select portions to the semiconducting and/or nonconducting compounds thereof to form electronic circuit elements thereof.

Multi-layer circuits may be developed employing synthetic diamond coatings or films deposited one above the other with or without interposing layers or films of insulating material disposed therebetween. Such multilayers may be formed of synthetic diamond deposited as described as microminiature transistors, microswitches, capacitors, inductors, resistors, or other components. Such forming processes may include (a) selectively depositing carbon atoms through select openings in a mask or (b) introducing carbon atoms into a narrow or focusing electron beam or laser beam, or (c) using laser beam or epitaxial beam etching, with or without a mast, of deposited synthetic diamond.

Particles for use as the core elements of the composite particles described herein may be fabricated by known techniques for producing powdered metal and ceramic materials or the following techniques which form part of the instant invention:

1. Such core particles may be produced by the rapid solidification of molten metal after one or more liquid streams thereof have been gas atomized using subsonic and/or supersonic gas directed against a continuously flowing stream or streams of metal. Such gas may comprise nitrogen, argon, air or helium in the form of a jet or jets or an annular ring of gas impinging the gas molecules against the molten metal to form particles which rapidly solidify to form fine core elements of non-crystalline or amorphous metal. The resultant particles may be collected and controllably fed on a continuous or intermittent basis to the synthetic diamond coating apparatus described herein or fed directly through an atmosphere containing molecules of carbon-containing compounds such as methane gas.

Intense microwave energy is directed through the particular atmosphere to effect the stripping of carbon atoms from the gas and their deposition on the freshly formed particles. The carbon-containing gas such as methane gas is employed to atomize the particles as the microwave energy is directed through the volume in which the particles are so formed and/or therebeyond. A cyclone reactor may be employed in which the particles so formed are caused to flow along a spiral or helical path, or a circular path using a suitable magnetic field generating means to maintain them and carbon-containing gas in the microwave energy field within the reactor for an extended period of time. The helical path of flow may also terminate in a chamber or portion of the reactor in which gas is flowed to fluidize the particles in the presence of microwave energy to cause the carbon atoms of the fluidizing gas molecules to deposit, as described, as synthetic diamond on the particles. Such process of forming the particles may be continuous or intermittent to provide a controlled amount of particles to the coating region of the chamber.

2. In a modified form of the described process for producing core particles to be coated with synthetic diamond or for any suitable application, two or more streams of different liquid metals, ceramic, cermet or glass materials or combinations thereof, may be directed acutely together to combine the two liquid materials. At the intersection of such streams and/or immediately therebeyond a sub-sonic or supersonic stream or jet of one or more of the described gases, breaks the molten material down into droplets by gas atomization. Thus composite particles of the two or more materials so combined include one or more in an amorphous or noncrystalline state. Coating with synthetic diamond may be effected thereafter as described on a continuous or intermittent basis as the particles flow or after they are collected and conveyed to coating apparatus as described. Combinations of two or more metals which are ordinarily difficult to alloy or combine, metal and glass or ceramic, combinations of ceramic or glass and two or more metals or alloys, etc. may be formed by mixing two or more molten streams of the respective materials and the gas atomization of the mixture immediately as it is formed.

Cutting tools and dies fabricated of composite structures as described may be produced by the following methods which form part of the instant invention:

1. A substrate defining the shape of the cutting tool, its blade or insert, is firm formed of hard material such as tool steel, a metal carbide, nitride, silicide or oxide. One or more cutting edge portions are formed with side walls which taper towards each other to an edge. Synthetic diamond is then deposited from carbon atoms of a gas, vapor or liquid or a combination of such materials disposed adjacent or coated completely around the tool surfaces or the tapered wall portions thereof. Microwave energy is generated and directed against the coating or gas and substrate to deposit the carbon atoms and form a synthetic diamond film thereof of a select thickness. To provide suitable wear resistance for the diamond film and/or to lubricate same to reduce friction and frictional heating during cutting, a thin plating or film of chromium is vapor-deposited or electrodeposited contiguously over the synthetic diamond coating and, if so structured, against adjacent substrate material. In a particular form, the chromium coating is only applied to the cutting edge portion or portions of the tool to lubricate same and reduce friction and wear during cutting operations.

2. In another form of the invention, a high wear resistant coating, such as synthetic diamond and/or chromium, is applied to the cutting edge portion or portions of the tool while it is operatively located and secured to a machine tool or tool holder. Vapor or gas deposition means such as an open end duct, waveguide, laser beam or electron gun beam generator and nozzle dispenser of gas or vapor molecules containing material may be used to deposit the desired coating material.

3. Tools which may be coated with synthetic diamond contiguously disposed around cutting edge portions thereof. Such tools include drill bits, milling cutters, lathe cutting tools and inserts, saw blades and saw blade teeth, and the like.

I claim:

1. A composite article of manufacture comprising:
   (a) a core formed of a hard, high strength solid material selected from the group consisting of diamond; synthetic diamond; amorphous carbon; graphite; a metal; a metal alloy; carbides, nitrides and oxides of tungsten, boron, titanium, zirconium, aluminum and chromium,
   (b) a thin layer of synthetic diamond-like material contiguously disposed, on the surface of said core and being bonded thereto,
   (c) said thin layer of synthetic diamond-like material being disposed completely around and forming an uninterrupted protective coating which completely surrounds said core,
   (d) a further layer of lubricating material contiguously disposed on said thin layer.

2. A composite article in accordance with claim 1 having
   the shape of a particle for use in forming a larger article composed of a plurality of such particles.

3. A composite article in accordance with claim 1 wherein
   said layer of synthetic diamond-like material is formed as a layer of atoms of carbon which have been stripped from molecules of a carbon atom containing gas disposed adjacent the surface of said core,
   said stripping being effected by radiant energy.

4. A composite article in accordance with claim 1 having
   the form of a particle having a dimension less than 0.005",
   said layer of synthetic diamond being less than 0.001" thick.

5. A composite article in accordance with claim 1 wherein
   said core is in the shape of a spheroid utilizable in a ball bearing.

6. A composite article in accordance with claim 1 wherein
   said core is in the shape of a roller utilizable in a roller bearing.

7. A composite article in accordance with claim 1 wherein
   said core is a single crystal comprising a high strength metal whisker.
   (a) a core in the form of a filament formed of a high strength material selected from the group consisting of steel, aluminum, titanium, nickel, tungsten, chromium; boron; carbides, nitrides, oxides, and borides of said steel, aluminum, titanium, nickel, tungsten, chromium; graphite; cermets and ceramics, (b) said core being elongated and substantially cylindrical in shape, (c) a synthetic diamond material formed in situ on and completely surrounding and bonded to the outer cylindrical surface of said core, and (d) a protective coating for said synthetic diamond material operable to reduce friction and wear on the surface of said synthetic diamond material during use, (e) said coating being composed of a material selected from the group consisting of chromium, vanadium, nickel and fluoroplastic resins.

8. A composite article in accordance with claim 1 wherein
said core is formed of amorphous metal.

9. A composite article in accordance with claim 1 having the form of a filament having a diameter between 0.0001" to 0.0006" and a length in the range of 0.001 to 0.250.

10. A composite article in accordance with claim 9 wherein
said core is formed of a metal whisker.

11. A composite article in accordance with claim 9 wherein
said core is formed of graphite.

12. A composite article in accordance with claim 9 wherein
said core is formed of a ceramic material.

13. A composite article in accordance with claim 1 wherein
said core is an abrasive bit having a maximum dimension varying between 0.001" to 0.060".

14. A high strength article of manufacture comprising in combination:

15. A composite article in accordance with claim 14 defining
a reinforcing filament having end wall portions,
said synthetic diamond material coating the entire outer surface of said filament including the end wall portions thereof.

16. A composite article in accordance with claim 14 defining
a roller for use in roller bearings, conveyors and the like.

17. A composition article of manufacture comprising:
(a) a core formed of a hard, high strength solid material selected from the group consisting of diamond, synthetic diamond; amorphous carbon; graphite, a metal; a metal alloy; carbides, nitrides and oxides of tungsten, boron, titanium, zirconium and chromium,
(b) a thin layer of synthetic diamond-like material contiguously disposed on the surface of said core and being bonded thereto,
(c) said thin layer of synthetic of diamond-like material being disposed completely around and forming an uninterrupted protective coating which completely surrounds said core, and
(d) a layer of chromium contiguously disposed on said layer of diamond-like material and completely surrounding said core.

18. A composite article of manufacture comprising:
(a) a core formed of a material selected from the group consisting of diamond; synthetic diamond; amorphous carbon; graphite; a metal; a metal alloy; carbides, nitrides and oxides of tungsten, boran, titanium, zirconium, aluminum and chromium,
(b) a coating of synthetic diamond-like material completely surrounding the core and bonded thereto,
(c) said coating being formed of a plurality of layers of synthetic diamond-like material deposited on the outer surface of said core, one layer above the other.

19. A composite article in accordance with claim 18 having
a spheroid shape for use as a plurality of similarly shaped spherical objects in a ball bearing.

20. A composite article in accordance with claim 18 having an elongated body of revolution with end wall portions formed at the ends of a sidewall portion,
said end walls and said sidewall portion being coated with said plurality of layers of synthetic diamond-like material.

21. A composite article of manufacture comprising:
(a) a core having a surface and being formed of a hard, high strength solid material selected from the group consisting of diamond; amorphous carbon; graphite; a metal; a metal alloy; carbides, nitrides and oxides of tungsten, boron, titanium, zirconium, aluminum and chromium.
(b) a layer of synthetic diamond-like material deposited on said surface to completely surround and cover, said core, and
(c) a thin layer of lubricating material bonded to said layer of said synthetic diamond-like material.

22. A composite article of manufacture comprising:
(a) a core formed of a hard, high strength, solid material selected form the group consisting of diamond; synthetic diamond; amorphous carbon, graphite; a metal element; a metal alloy; carbides, nitrides and oxides of tungsten, boron, titanium, zirconium, aluminum and chromium,
(b) said core being in the form of a filament having a diameter between 0.0001" and 0.006" and a length in the range of 0.001" to 0.250",
(c) a first layer of synthetic diamond-like material being bonded to and completely surrounding said core to form an uninterrupted protective coating, and
(d) a second layer of lubricating material contiguously disposed on said first layer.

* * * * *